US011378627B2

(12) United States Patent
Weinreiter et al.

(10) Patent No.: US 11,378,627 B2
(45) Date of Patent: Jul. 5, 2022

(54) ELECTRICAL BATTERY MONITORING DEVICE AND BATTERY

(71) Applicants: Airbus Helicopters Deutschland GmbH, Donauwörth (DE); Airbus Defence and Space GmbH, Taufkirchen (DE)

(72) Inventors: Philipp Weinreiter, Donauwörth (DE); Kristian Zimmermann, Donauwörth (DE)

(73) Assignees: AIRBUS HELICOPTERS DEUTSCHLAND GmbH, Donauwörth (DE); AIRBUS DEFENCE AND SPACE GmbH, Taufkirchen (DE)

( * ) Notice: Subject to any disclaimer, the term of this patent is extended or adjusted under 35 U.S.C. 154(b) by 394 days.

(21) Appl. No.: 16/530,332

(22) Filed: Aug. 2, 2019

(65) Prior Publication Data

US 2020/0041573 A1 Feb. 6, 2020

(30) Foreign Application Priority Data

Aug. 3, 2018 (EP) .................................. 18187243

(51) Int. Cl.
*G01R 31/382* (2019.01)
*G01R 31/36* (2020.01)
*H01M 10/48* (2006.01)

(52) U.S. Cl.
CPC ....... *G01R 31/382* (2019.01); *G01R 31/3646* (2019.01); *H01M 10/482* (2013.01); *H01M 10/486* (2013.01)

(58) Field of Classification Search
CPC ............. H01M 10/482; H01M 10/486; H01M 2200/00; H01M 2200/20; H01M 10/48;
(Continued)

(56) References Cited

U.S. PATENT DOCUMENTS

| 5,764,063 A | 6/1998 | Katou et al. |
| 2015/0132615 A1 | 5/2015 | Yun |
| 2016/0291114 A1 | 10/2016 | Bacquet et al. |

FOREIGN PATENT DOCUMENTS

| EP | 1 577 918 | 9/2005 |
| EP | 2 493 005 | 8/2012 |

(Continued)

OTHER PUBLICATIONS

Search Report for European Application No. EP18187243.3, nine pages, dated Feb. 18, 2019.
(Continued)

*Primary Examiner* — Anthony R Jimenez
(74) *Attorney, Agent, or Firm* — Nixon & Vanderhye P.C.

(57) ABSTRACT

A battery and an electrical battery monitoring device are disclosed having a first group of sensing switches connected in series on a first monitoring circuit, the sensing switches, a second group of electrical sensing switches connected in series on a second monitoring circuit, an input unit to provide an input to the first and second monitoring circuits, a monitoring unit to receive an output from the first and second monitoring circuits, wherein the monitoring unit receives at least two outputs from two measuring points of the first monitoring circuit, the two measuring points being separated by at least one sensing switch. The location of a defective battery cell may be early detected and precisely located by the monitoring of the battery cells in rows and columns.

15 Claims, 2 Drawing Sheets

(58) Field of Classification Search
CPC .. G01R 31/382; G01R 31/3646; G01R 19/00; G01R 19/0084; G01R 19/165; G01R 19/16542; G01R 19/16566; G01R 19/16571; G01R 19/16576; G01R 17/00; G01R 17/10; G01R 17/20; G01R 15/00; G01R 15/04; G01R 15/12; G01R 15/14; G01R 15/142; G01R 15/144; G01R 15/165; G01R 1/00; G01R 1/02; G01R 31/36; G01R 31/3644; G01R 31/3647; G01R 31/367; G01R 31/378; G01R 31/385; G01R 31/3835; G01R 31/396; B60L 58/00; B60L 58/10; B60L 58/24; B60W 2510/107; B60W 2510/246; B60W 2710/1072; B60W 2710/24; B60W 2710/246; G01D 3/00; G01D 3/028; G01K 7/00; G05D 23/00
USPC .......................................................... 429/90
See application file for complete search history.

(56) References Cited

FOREIGN PATENT DOCUMENTS

| | | | |
|---|---|---|---|
| JP | 3913411 | 2/2007 | |
| JP | 5245334 | 7/2013 | |
| WO | WO-2013097591 A | * 7/2013 | .......... H01M 10/052 |

OTHER PUBLICATIONS

Communication pursuant to Article 94(3) EPC for Application No. EP Application No. 18 187 243.3, five pages, dated Apr. 29, 2022.

* cited by examiner

ELECTRICAL BATTERY MONITORING DEVICE AND BATTERY

CROSS RELATED APPLICATION

This application claims priority to European Patent Application EP 18187243.3, filed Aug. 3, 2018, the entire contents of which are hereby incorporated by reference.

TECHNICAL FIELD

The invention relates to an electrical battery monitoring device and a battery comprising such monitoring device. In particular the invention relates to a monitoring device for monitoring the temperature of a plurality of battery cells within a battery, and for providing a safe battery.

BACKGROUND

Electrical batteries, such as for example Li-ion batteries, sometimes fail and may be a critical danger to their direct environment. In particular on-board a vehicle, and more particularly on-board an aircraft, the failure of a battery can lead to critical situations. Indeed, some battery cells may over-heat and catch fire or leak. As batteries are usually arranged as packs of battery cells, an overheated battery cell or a fire may quickly propagate to other battery cells thereby leading to a major incident.

The monitoring of a battery and the early detection of battery cell failure is therefore an essential part of a battery on-board an aircraft. It is even more the case that the amount of electrical batteries may increase with the increase of electrical devices on-board an aircraft, whether for aircraft systems, in-flight entertainment systems or even for propulsion.

However in order to optimize the energy density of a battery, the monitoring and detection of failure in a battery must remain as simple and light as possible. It is particularly critical in the aerospace industry where lightness is key to manufacture efficient aircrafts.

But modem batteries often comprise a very high number of battery cells, making their individual monitoring complicated, expensive and heavy.

JP3913411 discloses a plurality of battery cells attached to temperature sensors having an electrical resistance varying with temperature for detecting an abnormal temperature rise in the battery pack. The temperature sensor is divided into a plurality of temperature sensing blocks, each block having the same number of temperature sensors connected in series. The total resistance of a block of temperature sensors is measured to detect an abnormal temperature rise by comparison of the resistance value with a threshold value.

Such temperature sensor does not allow for the precise detection and location of a battery cell experiencing a default or an abnormal temperature within a battery pack.

The disclosure aims to provide an efficient monitoring device for monitoring a battery.

The disclosure aims to provide a monitoring device which would allow to precisely locate a battery failure.

The disclosure also aims to provide a monitoring device that would be light.

The disclosure also aims to provide a monitoring device that would be economical.

The disclosure also aims to provide a monitoring device that would be easily scalable.

The disclosure also aims to provide a monitoring device that would increase the safety of a battery.

The disclosure aims to provide a safe battery.

Moreover the disclosure aims to provide a battery that would be easy to maintain and repair in case of failure of the monitoring device or of a battery cell.

The disclosure proposes an electrical battery monitoring device comprising:
- a first group of electrical sensing switches connected in series on a first monitoring circuit, said sensing switches being adapted to switch between a first state and a second state depending on at least one parameter of at least one battery cell of the battery,
- a second group of electrical sensing switches connected in series on a second monitoring circuit, said sensing switches being adapted to switch between a first state and a second state depending on at least one parameter of at least one battery cell of the battery, the second monitoring circuit being electrically isolated from the first monitoring circuit,
- an input unit adapted to provide an electrical input to the first monitoring circuit and to the second monitoring circuit,
- a monitoring unit adapted to receive at least one electrical output from the first monitoring circuit and at least one electrical output from the second monitoring circuit, wherein:
- the first monitoring circuit comprises at least two measuring points connected to the monitoring unit,
- the monitoring unit is adapted to receive at least two electrical outputs from the at least two measuring points of the first monitoring circuit,
- the two measuring points are separated by at least one sensing switch.

In the whole text, the terms 'defect' or 'failure' or 'defective' are used in a broad meaning that can reflect their literal meaning, but also what an engineer would consider as a pre-defective situation of an element. The text may mention a 'defective battery cell' or a 'battery cell failure' although the battery cell is not per se defect but reaches a temperature that an engineer would estimate to be critical or even undesirable—for example for maintaining the safety of the battery or its environment to an acceptable level in view of regulations, or for maintaining the life expectancy of the battery cell, etc.

The sensing switches are adapted to be triggered depending on at least one predetermined parameter of at least one battery cell of the battery. When triggered, a sensing switch switches between a first state and a second state. A sensing switch may be triggered by two or more parameters.

In particular a sensing switch may be adapted to switch between a first state and a second state depending on a local predetermined parameter of a battery cell. The sensing switch is beneficially adapted to be placed in proximity to said battery cell.

The sensing switches may be of different types. They may for example be adapted to switch between a first state and a second state depending on a temperature, a presence of a predetermined gas, a presence of liquid and/or of a predetermined liquid, an acceleration and/or a pressure, etc.

The input unit is adapted to input an electrical input at a first input point to the first monitoring circuit and at a second input point to the second monitoring circuit. The electrical input may in particular be an electrical voltage. In particular the input unit may input a voltage corresponding to a value '1' in a binary logic gate.

The sensing switch being connected in series, the monitoring circuit are kept simple and thus easy to manufacture, thereby providing a light and economic battery monitoring device.

There may be one or more sensing switch between the input point on a monitoring circuit and any measuring point on that monitoring circuit. Similarly, there may be one or more sensing switch between two consecutive measuring points on a monitoring circuit.

There are beneficially at least two sensing switches between the input point on a monitoring circuit and any measuring point on that monitoring circuit and at least two sensing switches between two consecutive measuring points on a monitoring circuit. The more sensing switches there are between two measuring points of a monitoring circuit, the lighter and simpler will a monitoring device according to the invention be, compared to the number of battery cells to be monitored.

Also, the input point does not need to be on one side of all the sensing switches on a monitoring circuit. The input point may be between two groups of switches on a monitoring circuit.

Since the first monitoring circuit comprises at least two measuring points connected to the monitoring unit, the monitoring unit may be programmed to provide a warning output representative of a location of a default. The default may be that of a battery cell or that of a sensing switch.

By having two or more measuring points and outputs from a monitoring circuit, the location of a defect may be precisely determined based on all the outputs of said monitoring circuit.

A measuring point of a monitoring circuit may be physically connected to the monitoring unit or may be wirelessly connected to the monitoring unit.

A device according to the invention may be further be wherein:
- the second monitoring circuit comprises at least two measuring points connected to the monitoring unit,
- the monitoring unit is adapted to receive at least two electrical outputs from the at least two measuring points of the second monitoring circuit,
- the two measuring points are separated by at least one sensing switch.

Having multiple measuring points on each monitoring circuit allows to locate precisely a defective battery cell.

Indeed, having at least two monitoring circuits allows to avoid a false detection of a battery cell defect due to a defective sensing switch: even if a sensing switch is defective and triggers an output representative of a defect on one of the monitoring circuits, the sensing switches of a second monitoring circuit will keep having an output corresponding to nominal functioning conditions. Moreover, as will be seen the following, having multiple outputs on each monitoring circuit allows to locate precisely a defective battery cell in a battery.

Besides, having two monitoring circuits, allows monitoring a high number of battery cells with a low number of measuring points, and therefore a low number of outputs, resulting in a light, simple and economic monitoring device.

The first monitoring circuit may comprise at least two sensing switches between two consecutive measuring points.

The second monitoring circuit may comprise at least two sensing switches between two consecutive measuring points of the second monitoring circuit.

At least one last measuring point of the first monitoring circuit may be situated at an end of the first monitoring circuit; that is at a downstream point after a series of sensing switches after which the monitoring circuit does not have any additional sensing switch—the input point of the monitoring circuit being the upstream side of the monitoring circuit.

At least one last measuring point of the second monitoring circuit may be situated at an end of the second monitoring circuit; that is at a downstream point after a series of sensing switches after which the monitoring circuit does not have any additional sensing switch—the input point of the monitoring circuit being the upstream side of the monitoring circuit.

At least one sensing switch may be adapted to switch between a first state and a second state depending on temperature, in particular depending on its temperature.

At least one sensing switch is adapted to switch between a closed state and an open state depending on the temperature. More particularly the sensing switches may be adapted to switch from a closed state to an open state depending on the temperature. A sensing switch may be adapted to switch from a closed state to an open state when their temperature is over a predetermined threshold.

In normal functioning all sensing switches may be in the same state. In particular all are in a closed state. Thus, each monitoring circuit is continuous and adapted to transmit an electrical signal such as an electrical voltage. Such electrical voltage may for example be representative of a binary digital value '1'. As soon as at least one sensing switch of a monitoring circuit is triggered by the sensing of a predetermined parameter of at least one battery cell of the battery, the monitoring circuit is open, such that any output situated downstream from the triggered sensing switch—the input point of the monitoring circuit being the upstream side of the monitoring circuit—will change from an electrical voltage representative of a binary digital value 1' to an electrical voltage representative of a binary digital value '0'.

Such arrangement of the sensing switch and monitoring circuit also allows to detect a wire break on the monitoring circuit.

With an input unit inputting a voltage representative of a binary digital value '1', as soon as one sensing switch switches open on a monitoring circuit, the voltage at all measuring points after this switch goes down, close to zero, to correspond to binary digital value '0'.

Thus a temperature of a battery cell which is be over a predetermined threshold triggers the opening of a nearby sensing switch. The monitoring unit thus detects the change of output from at least one measuring point on at least one monitoring circuit. The monitoring unit may then, based on this output from the monitoring circuit, generate an output for controlling the battery's environment, for switching the battery off, for informing a control unit or a human, etc.

At least one sensing switch of the first monitoring circuit may be adapted to switch when the value of a predetermined parameter is higher or below a first predetermined threshold value, and at least one sensing switch of the second monitoring circuit is adapted to switch when the value of a predetermined parameter is higher or below a second predetermined threshold value, the second threshold value being higher than the first threshold value.

At least one sensing switch of the first monitoring circuit may be adapted to switch at a first temperature, and at least one sensing switch of the second monitoring circuit may be adapted to switch at a second temperature, the second temperature being higher than the first temperature.

In some embodiments, all sensing switches of the first monitoring circuit may be adapted to switch at a first temperature, and all sensing switches of the second monitoring circuit may be adapted to switch at a second temperature, the second temperature being higher than the first temperature.

In a monitoring device according to the invention, the having sensing switches switching at different temperatures—or more generally at different threshold values—may be beneficial to obtain a good quality of the monitoring.

First, a common mode failure of two sensing switches on two different monitoring circuit is reduced.

Second, if a sensing switch of the second monitoring circuit with a higher threshold is triggered while no sensing switch of the first monitoring circuit with a lower threshold is triggered, the probability that the sensing switch of the second monitoring circuit is defective is high. Therefore the battery may be continued to be used until replacement of the defective sensing switch.

Also, having sensing switches switching at different thresholds allows to provide a pre-warning to a controlling system or to a human such as a pilot of an aircraft for example. It may allow to choose a first threshold value that is not critical for the use of the battery, such that the battery may be continued to be used, but which will trigger attention such that the battery may be spared and another on-board battery may be used if there are many batteries. The triggering of a second sensing switch coherent with the first triggered sensing switch provides a high degree of certainty that a particular battery cell or group of battery cell is defective.

Having sensing switches switching at different thresholds may also provide a temperature gradient information and/or a propagation information. For example, one or more sensing switch may have been triggered at one location corresponding to a determined battery cell, and nearby sensing switch with a low threshold may shortly afterwards be triggered, thus indicating a propagation of the overheating situation to nearby battery cells.

The threshold values may be chosen such that the battery cell is not yet defective when the threshold is reached.

In particular the higher temperature threshold may be chosen lower than a critical temperature corresponding to a critical failure of a battery cell, such that the failure may be detected before a critical event happens, and such action such as disconnection of the battery may be made before the battery cell reaches a critical state. Thus, the temperature thresholds at which one or more sensing switch are triggered may be chosen such as to detect an overheating of a battery cell, although the battery cell is not defect, neither on fire nor in a critical situation.

A device according to the invention may therefore provide for a particularly safe battery.

A device according to the invention may further comprise a safety device. The safety device may be of different types such as a refrigerating unit, and/or a device adapted to disconnect the battery from an electrical circuit on which it is connected, and/or a device adapted to inject a gas such as an inert gas or a liquid such as an extinguishing liquid or foam, etc.

A device according to the invention may further comprise:
a controlled switch on at least one electrical output of the battery,
a controller adapted to open the controlled switch.

The controller and the controlled switch may be part of a safety device adapted to disconnect the battery from an electrical circuit on which it is connected.

The controller may be integrated in the monitoring unit or may be a processing unit receiving inputs from the monitoring unit.

Alternatively or in combination, the controller may actuate independently upon the reception of at least one output from at least one of the first monitoring circuit and the second monitoring circuit.

The controlled switch may be placed at the battery contactors with an electrical network such as for example a high-voltage power network of an aircraft.

The controller may be adapted to open the controlled switch upon reception of at least one predetermined output from at least one of the first monitoring circuit and the second monitoring circuit.

The controller may actuate upon reception of at least one output from the first monitoring circuit and one output from the second monitoring circuit. More particularly the controller may receive outputs of the (or each of the) last measuring point on the first monitoring circuit and of the (or each of the) last measuring point on the second monitoring circuit—'last' being understood as downstream from any sensing switch of the monitoring circuit, the input point being the upstream point.

The controller may be adapted to open the controlled switch exclusively upon reception of a first output from the first monitoring circuit and of a second output from the second monitoring circuit.

Such design may provide a very reactive safety system in which the battery is immediately electrically disconnected after triggering of one or more sensing switch, without involving processing delay or human reaction delay.

In particular the controller may be adapted to open the controlled switch upon reception of an output representative of a triggered sensing switch on the first monitoring circuit, and of an output representative of a triggered sensing switch on the second monitoring circuit. Since the sensing switches are connected in series, if any sensing switch is triggered on the first monitoring circuit and any sensing switch is triggered on the second monitoring circuit, the controller may open the controlled switch so as to disconnect the battery. Indeed the double failure of a sensing switch on the first monitoring circuit and a sensing switch on the second monitoring circuit will be statistically most of the time due to a defective battery cell triggering both sensing switches from each monitoring circuit. This allows to stop an overheating of the battery due to the draw of current from it as soon as an overheated battery cell or group of battery cells is detected simultaneously by a sensing switch of the first monitoring circuit and a sensing switch of the second monitoring circuit. In that case the electrical output of the battery may be open so that the battery cells, and in particular the defective battery cell but also the surrounding battery cells, will not be solicited anymore, such that the defect may be contained.

The controller may for example be a logic gate of which the output controls the state of at least one controlled switch, based on the outputs from a measuring point of the first monitoring circuit and of a measuring point of the second monitoring circuit. The controller may for example be a gate 'OR' or 'NOR' receiving two inputs representative of a value '1' from the first monitoring circuit and the second monitoring circuit in normal conditions, and receiving two inputs representative of a value '0' from the first monitoring circuit and the second monitoring circuit in case at least one battery cell is defective.

Alternative embodiments may be chosen in which the controller switches the controlled switch based on only one modified output from either the first monitoring circuit of the second monitoring circuit. In such embodiments, the controller may for example be a gate 'AND' or 'NAND', such that the controlled switch is open as soon as one output from one the first monitoring circuit or the second monitoring circuit is representative of a triggered sensing switch.

The battery may comprise at least one sensing pair comprising at least one sensing switch of the first group and at least one sensing switch of the second group in proximity to each other.

The proximity between the two sensing switches of a sensing pair is here defined in relation to the dimensions of a battery cell. Thus a sensing pair comprising a sensing switch of the first group and a sensing switch of the second group are adapted to be placed in proximity to a same battery cell.

A sensing pair may be placed in proximity to a same group of battery cells.

Having a sensing pair comprising one sensing switch of each monitoring circuit placed in proximity to a battery cell allows to specifically monitor this battery cell, such that a defective battery cell may be easily and precisely located. This may allow for a quick and easy replacement of the defective battery cell.

Nonetheless, nothing prevents to arrange a sensing switch of the first monitoring circuit and a sensing switch of the second monitoring circuit in proximity to a group of two or more battery cells. This may allow to obtain a lighter and less complex monitoring device. This may allow to use a much lighter and simpler monitoring unit, and it reduces the amount of wiring in a battery. For example, one sensing switch of the first monitoring circuit and one sensing switch of the second monitoring circuit may be placed in the middle of a group of four battery cells, such that the location of a defective battery cell remain relatively easy and quick.

A device according to the invention may further be wherein:
- the at least two measuring points of the first monitoring circuit separate at least two groups, called monitored columns, of sensing switches,
- the second monitoring circuit comprises at least two measuring points separating at least two groups, called monitored rows, of sensing switches,
- at least two consecutive sensing switches of the first monitoring circuit pertaining to a same monitored column, each form a sensing pair with a sensing switch of two sensing switches of the second monitoring circuit, the two sensing switches of the second monitoring circuit pertaining to two different monitored rows.

Two sensing switches pertain to a same monitored column or to a same monitored row when there is no measuring point between them on the corresponding monitoring circuit.

A group of sensing switches between an input point and a measuring point also forms a 'monitored column' or a 'monitored row' respectively.

The monitoring device may be adapted to monitor a battery comprising a plurality of battery cells arranged in rows and columns, the first monitoring circuit comprising at least a first sensing switch for a first column of battery cells and at least a second sensing switch for a second column of battery cells, the second monitoring circuit comprising at least a first sensing switch for a first row of battery cells and at least a second sensing switch for a second row of battery cells.

The first monitoring circuit may comprise a measuring point between the first sensing switch for a first column of battery cells and the second sensing switch for a second column of battery cells.

The second monitoring circuit comprises a measuring point between the first sensing switch for a first row of battery cells and the second sensing switch for a second row of battery cells.

The triggering of one sensing switch on one monitoring circuit provides a relative location of the defective sensing switch or defective battery cell. For example, the triggering of a sensing switch on the first monitoring circuit provide information on a column in which a sensing switch or a battery defect has happened. The triggering of only one sensing switch of one monitoring circuit may be representative of a defective sensing switch or may be a pre-warning of a defective battery cell—in particular in the case of sensing switches with different triggering threshold on each monitoring circuit.

The triggering of one sensing switch on the first monitoring circuit and of one sensing switch on the second monitoring circuit may provide a precise location of a defective battery cell (or defective group of battery cells) if the location of the two sensing switches are coherent; otherwise the non-coherent triggering of a first sensing switch of the first monitoring circuit and of a second sensing switch of the second monitoring circuit may be representative of two independent failures of sensing switches. The monitoring of a plurality of battery cells is thus very accurate with a device according to the invention.

In some advantageous embodiments the first monitoring circuit may comprise a plurality of sensing switches on each column of battery cells, and the second monitoring circuit may comprise a plurality of sensing switches on each row of battery cells. More particularly, the first monitoring circuit may comprise at least one sensing switch on each battery cell, and the second monitoring circuit may comprise at least one sensing switch on each battery cell. The location of a defective battery cell is therefore very precise because a defective battery cell will trigger at least one sensing switch from the first monitoring circuit and at least one sensing switch from the second monitoring circuit, thereby allowing to deduce the precise location of the defective battery cell.

A device according to the invention allows to monitor a high number of battery cells individually, with only two inputs and a low number of outputs. Having a low number of outputs means that the wiring of the monitoring device is limited and that the monitoring unit for analyzing these outputs may be small, simple and light. For example, in a battery cluster of twenty-five battery cells arranged in five rows and five columns, the first monitoring circuit will have five outputs, and the second monitoring circuit will have another five outputs, making it ten outputs to monitor individually 25 battery cells. For a matrix of ten rows and ten columns of battery cells, a device according to the invention will have only twenty outputs for a hundred battery cells individually monitored.

An exemplary high-voltage Li-ion battery with fifteen parallel strings of 200 battery cells connected in series (often designated 200s15p) has 3000 battery cells. A device according to the invention allows a precise, safe and reliable detection of a defect or overheat situation on any of these battery cells individually with only 215 outputs.

The first monitoring circuit and the second monitoring circuit may be arranged to each connect sensing switches in a manner that divide the battery cells of a battery in a first plurality of groups of battery cells called 'columns' and in a second plurality of groups of battery cells called 'rows', each battery cell pertaining to at least one row and at least one column. This may be the case even in a battery in which the battery cells are not spatially or electrically arranged in rows and columns. According to the invention, the design of the monitoring circuits does not need to follow the spatial or electrical arrangement of the battery cells.

In order to minimize the number of outputs compared to the number of monitored battery cells, the number of measuring points and/or outputs of the second monitoring circuit is beneficially the same as the number of measuring points and/or outputs of the first monitoring circuit, plus or minus a 10% difference and in particular plus or minus one. The number of measuring points and/or outputs of the second monitoring circuit is beneficially the same as the number of measuring points and/or outputs of the first monitoring circuit, plus or minus a 10% difference. More particularly the number of measuring points and/or outputs of the second monitoring circuit is beneficially the same as the number of measuring points and/or outputs of the first monitoring circuit, plus or minus one.

In some embodiments it may be possible to have exactly the same number of monitored rows and monitored columns (and thus the same number of measuring points and/or outputs) on the first monitoring circuit and on the second monitoring circuit, thereby allowing to obtain a minimal number of outputs for a maximum of battery cells 15 monitored.

In the example mentioned above of a battery with 3000 battery cells, the cells may be artificially monitored as would be 55 columns and 55 rows with corresponding first monitoring circuit and second monitoring circuit. Then the total amount of outputs is 110 which constitutes a reduction by a factor 27 compared to an individual monitoring of each of the 3000 battery cells.

The invention also extends to an electrical battery comprising:
- a plurality of battery cells,
- a monitoring device comprising:
  - a first group of electrical sensing switches connected in series on a first monitoring circuit, said sensing switches being adapted to switch between a first state and a second state depending on at least one parameter of at least one battery cell of the battery,
  - a second group of electrical sensing switches connected in series on a second monitoring circuit, said sensing switches being adapted to switch between a first state and a second state depending on at least one parameter of at least one battery cell of the battery, the second monitoring circuit being electrically isolated from the first monitoring circuit,
  - an input unit adapted to provide an electrical input to the first monitoring circuit and to the second monitoring circuit,
  - a monitoring unit adapted to receive at least one electrical output from the first monitoring circuit and at least one electrical output from the second monitoring circuit,
- wherein:
- the first monitoring circuit comprises at least two measuring points connected to the monitoring unit,
- the monitoring unit is adapted to receive at least two electrical outputs from the at least two measuring points of the first monitoring circuit,
- the two measuring points are separated by at least one sensing switch.

A battery according to the invention is particularly simple to manufacture and light. Such battery is also particularly safe and reliable. The maintenance of such battery is particularly facilitated and quick.

In a battery according to the invention, the at least two measuring points of the first monitoring circuit may separate at least two groups, called monitored columns, of sensing switches.

The second monitoring circuit may comprise at least two measuring points separating at least two groups, called monitored rows, of sensing switches.

In some embodiments, the battery cells may be arranged in a matrix forming at least two columns and at least two rows. As mentioned before, the battery cells do not need to be spatially or electrically arranged in rows and columns, but rather the connection of the sensing switches by the monitoring circuit divide the battery cells into a first plurality of groups of battery cells called 'monitored columns' and in a second plurality of groups of battery cells called 'monitored rows'.

Moreover a matrix of battery cells may comprise one layer or many layers. The battery may thus comprise battery cells arranged in three dimensions to form rows, columns, and layers. The monitoring device may comprise two or more independent monitoring circuits: it may for example comprise three monitoring circuits—one for each of the three dimensions, or it may also comprise two monitoring circuits per layer, etc..

The battery may comprise at least one measuring point at at least two ends of a column of battery cells.

In particular a first monitoring circuit may comprise a measuring point at each end of a column, except an end at which an input is received.

Such arrangement allows to detect precisely on which row a sensing switch has been triggered.

The battery may comprise at least one measuring point at at least two ends of a row of battery cells.

In particular a first monitoring circuit may comprise a measuring point at each end of a row, except an end at which an input is received.

Such arrangement allows to detect precisely on which row a sensing switch has been triggered, in combination with a first monitoring circuit comprising a measuring point at each end of a column, except an end at which an input is received, it allows to precisely locate a defect battery cell.

A battery cell may be proximate to at least one sensing pair comprising at least one sensing switch of the first group and to at least one sensing switch of the second group.

Each battery cell may be proximate to at least one sensing switch pertaining to at least one monitored row of the first monitoring circuit and to at least one sensing switch pertaining to at least one monitored column of the second monitoring circuit.

Alternatively or in combination, a group of battery cells may be proximate to at least one sensing switch pertaining to at least one row of the first monitoring circuit and to at least one sensing switch pertaining to at least one column of the second monitoring circuit.

Each battery cell may be proximate to a sensing switch from the first monitoring circuit and to a sensing switch from the second monitoring circuit.

In that way, failure of a battery cell or of a group of battery cells may be dually detected by a sensing switch of the first group, and by a sensing switch of the second group, thereby allowing the precise location of the defective battery cell (or group of battery cells) and also thereby excluding a false detection due to a defective sensing switch; all while keeping a light and simple monitoring device with a minimum number of electrical measuring points and connections.

Besides, having one sensing switch of the first group as well as one sensing switch of the second group for each battery cell allows to selectively identify a defective sensing switch or a defective battery cell, in particular when the sensing switches are triggered by reaching a threshold temperature, and more particularly when the threshold temperature of the sensing switch of the first group is different from the threshold temperature of the sensing switch of the second group.

According to the invention, it is also possible to arrange one sensing switch of the first group and one sensing switch of the second group proximate to a group of battery cells instead of proximate to each battery cell, in order to limit the number of sensing switches and wirings. It may also be possible to have less sensing switches per number of battery cells on a first monitoring circuit than the number of sensing switches per number of battery cells on a second monitoring circuit. For example the second monitoring circuit may have one sensing switch per battery cell and the first monitoring circuit have one sensing switch for every two battery cells.

A sensing switch may, for example, be placed:
between two adjacent battery cells in a row or in a column, or
between four adjacent battery cells in a matrix, or
between eight adjacent battery cells, with four battery cells from a first layer of battery cells and a second layers of battery cells.

A battery cell or group of battery cell may also be equipped with more than two sensing switches, which may each have a different triggering threshold (for example a different temperature threshold). This may improve the reliability of a failure detection and allow to confirm or not the triggering of a first sensing switch by the triggering (or non-triggering) of a second sensing switch, thereby allowing to differentiate easily a sensing switch failure from a battery cell failure.

A battery according to the invention may also comprise a plurality of battery cell clusters, each cluster being equipped with at least one safety device. A safety device may for example be, as described before an association of a controller and a controlled switch on the cluster's electrical output. A monitoring device according to the invention allows in effect to locate a defect battery cell, such that it is possible to identify a cluster to which such battery cell pertains and to trigger a safety device specifically only for this cluster. In particular only one cluster of battery cells may be disconnected from an electrical circuit upon detection of a failure.

The invention also extends to other possible combinations of features described in the above description and in the following description relative to the figures. In particular, the invention extends to batteries comprising features described in relation to the monitoring device and the invention extends to monitoring devices comprising features described in relation to the battery.

BRIEF DESCRIPTION OF THE DRAWINGS

For an understanding of embodiments of the disclosure, reference is now made to the following description taken in conjunction with the accompanying drawings, in which.

In the accompanying drawings, like reference characters refer to the same or similar parts throughout the different views. The drawings are not necessarily to scale, emphasis instead being placed upon illustrating particular principles, discussed below.

DETAILED DESCRIPTION

Some embodiments will now be described with reference to the Figures.

Figure 1:
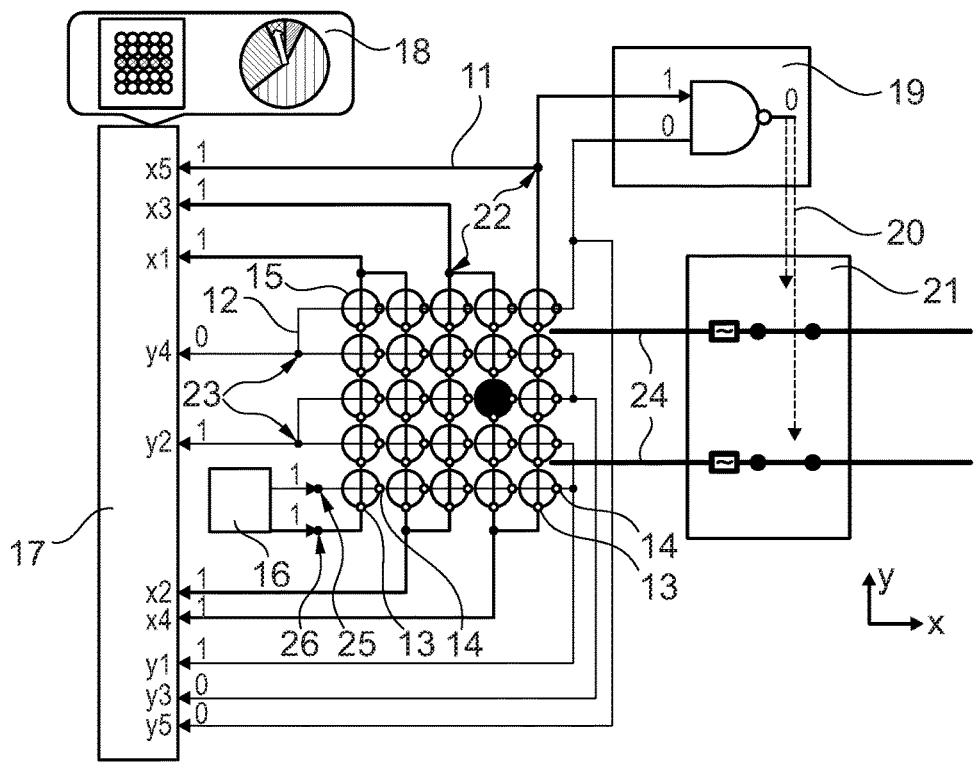
FIG. 1 is a schematic representation of a first battery embodiment according to the invention, in a first situation.

In FIG. 1 a battery is represented which comprises a plurality of battery cells 15. The battery cells 15 are arranged in rows y1, y2, y3, y4 and y5 of five battery cells each extending along the direction x, and in columns x1, x2, x3, x4 and x5 of five battery cells extending along the direction y. As mentioned before, and as will be seen in connection with the embodiment of FIG. 4, this may be the real spatial arrangement of the battery cells or may be a graphical simplification to better visualize the monitoring circuits.

In this embodiment, each battery cell is equipped with one sensing switch 13 connected to a first monitoring circuit 11 and with one sensing switch 14 connected to a second monitoring circuit 12. The first monitoring circuit 11 and the second monitoring circuit 12 thus each comprise twenty-five sensing switches 13, 14.

All sensing switches 13, 14 are temperature sensing switches.

All sensing switches 13 of the first monitoring circuit 11 are the same and have a first temperature threshold value. For example this first temperature threshold value may be between 70 degrees Celsius and 100 degrees Celsius, for example of 90 degrees Celsius.

All sensing switches 14 of the second monitoring circuit 12 are the same and have a second temperature threshold value different and lower than the first temperature threshold value. For example this second temperature threshold value may be between 60 degrees Celsius and 90 degrees Celsius, for example of 80 degrees Celsius.

The sensing switches 13, 14 may for example be bi-metal-temperature switches or fuses. They may be for example of the type of the reference BK02-BB8D from the manufacturer Supert Industrial Co. Limited.

The first monitoring circuit 11 connects all sensing switches 13 with a first temperature threshold in series along columns in a meandering pattern. The second monitoring circuit 12 connects all sensing switches 14 with a second temperature threshold in series along rows in a meandering pattern.

The monitoring circuits 11, 12 may for example comprise conventional wirings, integrated circuits on rigid or flexible supports, etc..

The monitoring circuits are each connected at a respective input point 25, 26 to an input unit 16 adapted to provide an electrical input on each monitoring circuit. The input points 25, 26 define the upstream side of the monitoring circuits 11, 12. The sensing switches 13, 14 and the measuring points are all downstream from the inputs points 25, 26.

The input unit 16 is adapted to input an electrical voltage representative of a binary digital value '1' on each monitoring circuit 11, 12.

The first monitoring circuit 11 comprises a measuring point 22 at each end of a column, except at the first end of the first column (bottom left) at which an input is inputted by the input unit 16 on the first monitoring circuit 11. The second monitoring circuit 12 comprises a measuring point 23 at each end of a row, except at the first end of the first row (bottom left) at which an input is inputted by the input unit 16 on the second monitoring circuit 12.

Each two consecutive measuring points 22, 23 are separated from each other by five battery cells 15. Each measuring point 22, 23 is connected to a monitoring unit 17 receiving the voltage of the measuring points as inputs (outputs of the monitoring circuits) for the columns x1, x2, x3, x4 and x5 and for the rows y1, y2, y3, y4 and y5.

By default and in normal conditions, all sensing switches 13, 14 are closed and the monitoring circuits 11, 12 are continuous such that the voltage inputted at the input points 25, 26 propagates to the entire monitoring circuits and all points of a monitoring circuit, in particular all measuring points are at the same voltage.

The monitoring unit 17 is adapted to determine, based on the outputs of the monitoring circuits 11, 12 which sensing switch has been triggered.

In FIG. 1, a situation is represented in which a battery cell 15 situated at the intersection between the third row y3 and the fourth column x4 is overheating. The overheating battery cell 15 is represented in black in FIG. 1. As a consequence, a sensing switch 14 of the second monitoring circuit 12 has been triggered. As soon as the sensing switch is triggered the outputs y3, y4 and y5 of the three upper rows go down to a low value representative of a binary digital value '0'. The monitoring unit 17 is thus adapted to determine that a defect has happened on the third row y3. The triggering of the sensing switch may also be due to a defective sensing switch 14.

Figure 2:
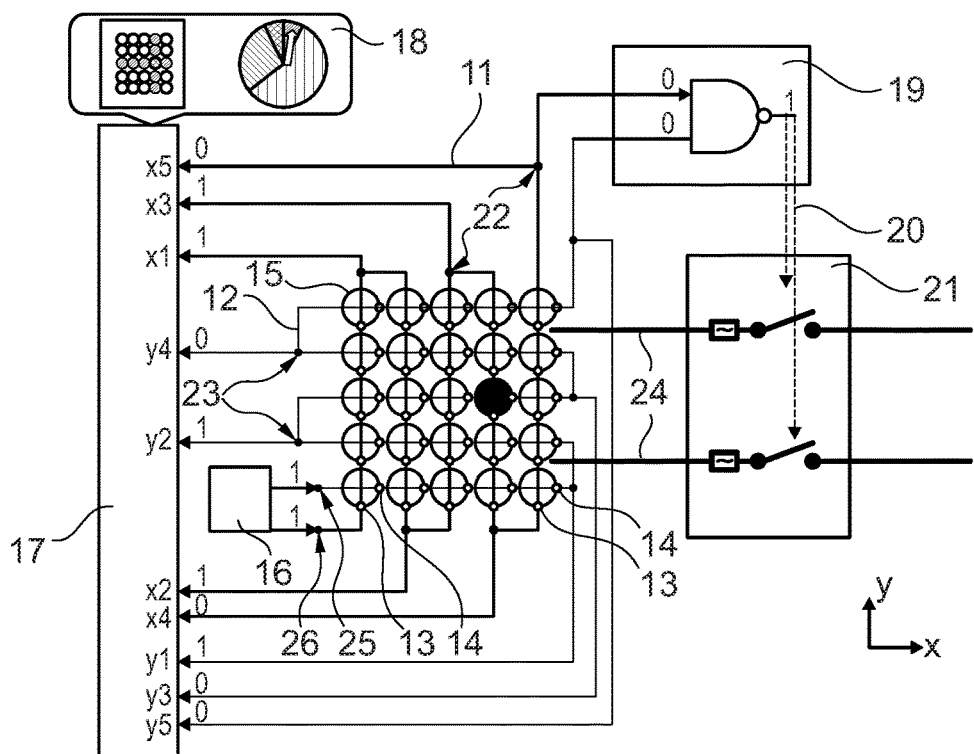
FIG. 2 is a schematic representation of the battery of FIG. 1, in a second situation.

In FIG. 2, a situation is represented in which a sensing switch 14 of the second monitoring circuit 12 has been triggered and a sensing switch 13 of the first monitoring circuit 11 has also been triggered.

Although this may be due to two defective sensing switch, one being situated on the third row y3 and one on the fourth column x4, a dual failure of two sensing switch is statistically low. The higher probability is that the battery cell 15 situated at the intersection between the third row y3 and the fourth column x4 is overheating. The temperature of the defective battery cell 15 increased between the situation of FIG. 1 and the situation of FIG. 2. Once the second sensing switch 13 of the first monitoring circuit 11 has been triggered the outputs x4, and x5 of the two right columns go down to a low value representative of a binary digital value '0'. The monitoring unit 17 is thus adapted to determine that the battery cell 15 situated at the intersection between the third row y3 and the fourth column x4 is overheating.

The situation of FIG. 1 may thus be representative of a pre-warning of a potential overheating on the third row, and the situation of the FIG. 2 as a confirmed overheating of a battery cell 15.

A monitoring device according to the invention therefore allows both a pre-warning and a precise location of a defective battery cell.

Furthermore, in the embodiment presented in relation to FIGS. 1 and 2, the battery further comprises a controller 19 and two controlled switches 21 on the electrical output 24 of the battery. The controlled switches 21 are controlled by the controller 19 through a command circuit 20 and may be opened by the controller 19 so as to disconnect the battery from its electrical network.

The controller 19 receives, as inputs, one output from the first monitoring circuit 11 and one output from the second monitoring circuit 12. More specifically the controller receives one output from the last measuring point 22 of the first monitoring circuit 11—last being considered downstream, the input point at which the input device 16 inputs a voltage on the first monitoring circuit being considered upstream. Similarly the second input of the controller 19 is an output from the last measuring point 23 of the second monitoring circuit 12.

In this embodiment, the controller 19 is a logic gate 'NAND'. As long as at least one of its inputs are representative of a binary digital value '1' the output of the controller remains at a binary digital value '0' and the controlled switches 21 remain closed. Therefore, if one or more sensing switch on only one monitoring circuit is (are) triggered, the battery remains on the power network. This is allows to choose a second temperature threshold low enough to inform a user or a system with a pre-warning of a potential overheating, without disconnecting immediately the battery from its electrical network.

If both inputs are representative of a binary digital value '0' the output of the controller changes to a binary digital value '1' and the controlled switches 21 open, so that the battery is disconnected immediately from its electrical network. Indeed, if at least one sensing switch of each of the two monitoring circuits is triggered, the probability that a battery cell is overheating is high and therefore the battery is protected by being disconnected. This is even more the case when the first temperature threshold is chosen close to a temperature representing an overheating of a battery cell.

The monitoring unit may be connected to a display 18. The display 18 may for example be a display in a cockpit for informing a pilot. The display 18 may also be a display on ground for a person in charge of the maintenance of the battery. The display 18 may comprise, as shown on the left, a graphical representation of the battery cells spatial arrangement. The graphical representation may use colors to indicate which battery cells 15 are in normal conditions, and which are defective. For example on FIG. 1, a row in which a defective sensing switch or battery cell has been detected may be highlighted or appear in a different color. In FIG. 2, a specific color may be attributed to the battery cell at the crossing of the column and the row which each comprise a triggered sensing switch to identify easily the defect battery cell.

The display 18 may also comprise a more generic information display such as shown on the right side, with an indicator comprising three areas: a first area corresponding to a nominal condition of the battery, a second area indicating a pre-warning situation (or a defect sensing switch), and a third area indicating an overheating situation of at least one battery cell. Therefore the indicator is represented in the second area on FIG. 1 and in the third area on FIG. 2.

Figure 3:
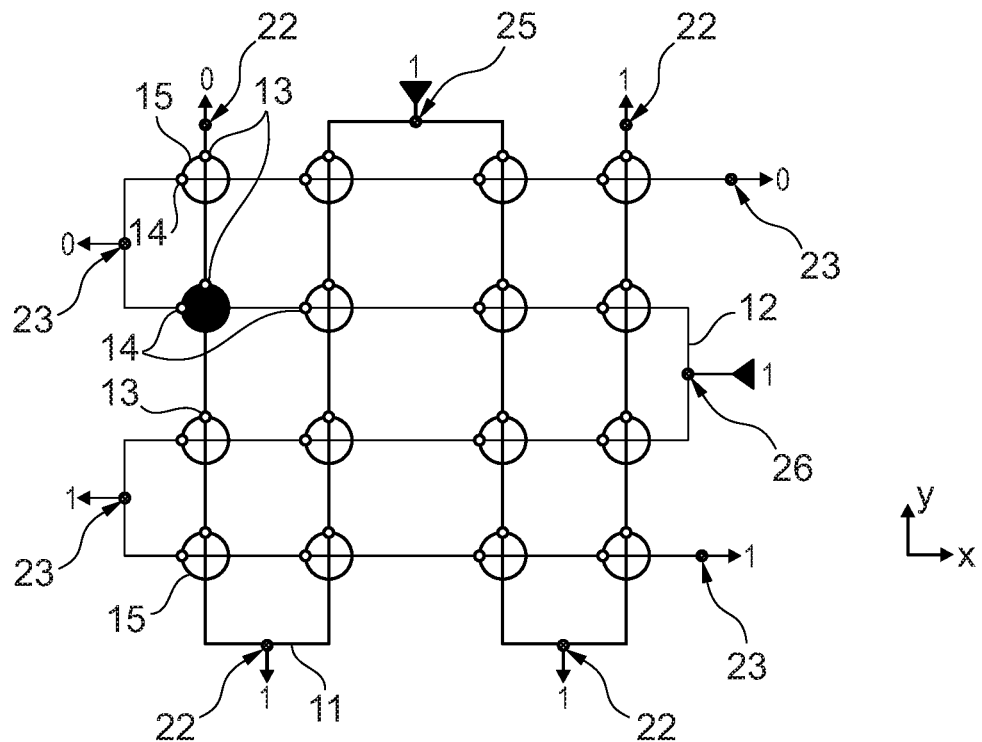
FIG. 3 is a schematic representation of a portion of a second battery embodiment according to the invention.

In FIG. 3, an alternative arrangement of the monitoring circuits 11, 12 is represented. In this embodiment, the first monitoring circuit 11 receives and input at an input point 25 situated in the middle of the monitoring circuits, with two groups of sensing switches on each side of the input point. The second monitoring circuit 12 also receives and input at an input point 26 situated in the middle of the monitoring circuits, with two groups of sensing switches on each side of the input point.

In this Figure a situation is represented in which the battery cell15 situated at the intersection of the column x1 and the row y3 is overheating and its corresponding sensing switches 13, 14 have both been triggered, such that the output x1 of the first monitoring circuit 11 and y3 and y4 of the second monitoring circuit 12 are representative of a binary digital value '0'.

Figure 4:
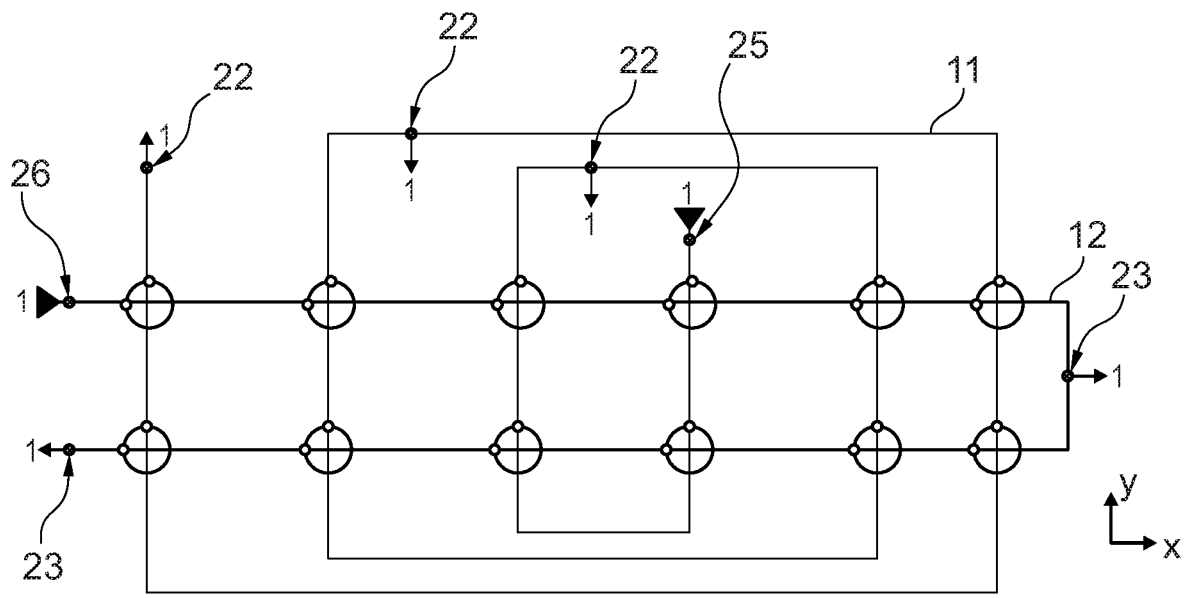
FIG. 4 is a schematic representation of a portion of a third battery embodiment according to the invention.

In FIG. 4 another alternative arrangement of the monitoring circuits 11, 12 is represented. In this embodiment, the first monitoring circuit 11 forms a different pattern so as to divide the six spatial columns of battery cells 15 into only three columns in terms of monitoring. This allows to reduce the number of outputs, and therefore simplify the monitoring device. To do so, the first monitoring circuit comprises two groups of two battery cells 15 (two spatial columns) between the input point 25 and the first measuring point, and between two successive measuring points.

The sensing switches 14 of the first monitoring circuit 11 placed in proximity to the battery cells of the two spatial columns x3 and x4 of battery cells pertain to the same monitored column according to the wiring of the first monitoring circuit 11 because they all four are situated between an input point 25 and a measuring point. Similarly, the sensing switches 14 of the first monitoring circuit 11 placed in proximity to the battery cells of the two spatial columns x2 and x5 pertain to the same monitored column according to the wiring of the first monitoring circuit 11 because they all four are situated between two consecutive measuring points. The sensing switches 14 of the first monitoring circuit 11 placed in proximity to the battery cells of the two spatial columns x1 and x6 also pertain to the same monitored column according to the wiring of the first monitoring circuit 11 because they all four are situated between two consecutive measuring points.

The total number of outputs is thus 5 instead of 8 if the spatial arrangement of the battery cells had been followed. The specific wiring of the first monitoring circuit 11 transforms the spatial arrangement of the battery cells into a more quadratic arrangement with only 2 monitored rows and 3 monitored columns.

The invention is not limited to the specific embodiments herein disclosed as examples. The invention also encompasses other embodiments not herein explicitly described, which may comprise various combinations of the features herein described.

In particular a sensing switch may be adapted to be triggered based on any type of relevant parameter relative to a battery cell, including parameters not listed herein.

Also, the arrangement of the monitored columns and monitored rows, the pattern formed by any monitoring circuit and the spatial arrangement of the battery cells may vary and differ in many ways from the exemplary embodiments described herein.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electrical battery monitoring device, comprising:
a first group of electrical sensing switches connected in series on a first monitoring circuit, said first group of electrical sensing switches are configured to switch between a first state and a second state depending on at least one parameter of at least one battery cell of a battery;
a second group of electrical sensing switches connected in series on a second monitoring circuit, said second group of electrical sensing switches are configured to switch between a first state and a second state depending on at least one parameter of at least one battery cell of the battery, the second monitoring circuit being electrically isolated from the first monitoring circuit;
an input unit connected to the first monitoring circuit at a first input point and to the second monitoring circuit at a second input point, said first input point adapted to provide an electrical input to the first monitoring circuit and to the second monitoring circuit;
a monitoring unit adapted to receive at least one electrical output from the first monitoring circuit and at least one electrical output from the second monitoring circuit;
wherein the first monitoring circuit comprises at least two measuring points connected to the monitoring unit, said at least two measuring points being located downstream and separated from the first input point by at least one sensing switch of the first group;
wherein the monitoring unit is configured to receive at least two electrical outputs from the at least two measuring points of the first monitoring circuit; and,
wherein the two measuring points are separated by at least one sensing switch.

2. The device according to claim 1, wherein
the second monitoring circuit comprises at least two measuring points connected to the monitoring unit, said at least two measuring points being located downstream and separated from the second input point by at least one sensing switch;
the monitoring unit is adapted to receive at least two electrical outputs from the at least two measuring points of the second monitoring circuit; and,
the two measuring points are separated by at least one sensing switch.

3. The device according to claim 1, wherein the first monitoring circuit comprises at least two sensing switches between two consecutive measuring points.

4. The device according to claim 1, wherein at least one sensing switch of the first group or second group of electrical sensing switches is configured to switch between a first state and a second state depending on temperature.

5. The device according to claim 1, wherein at least one sensing switch of the first monitoring circuit is adapted to switch at a first temperature, and at least one sensing switch of the second monitoring circuit is adapted to switch at a second temperature, the second temperature being higher than the first temperature.

6. The device according to claim 1, further comprising at least one sensing switch of the first group and at least one sensing switch of the second group in proximity to each other.

7. The device according to claim 1, wherein
the at least two measuring points of the first monitoring circuit separate at least two groups, called monitored columns, of sensing switches;
the second monitoring circuit comprises at least two measuring points separating at least two groups, called monitored rows, of sensing switches; and,
at least two consecutive sensing switches of the first monitoring circuit pertaining to a same monitored column, each form a sensing pair with a sensing switch of two sensing switches of the second monitoring circuit, the two sensing switches of the second monitoring circuit pertaining to two different monitored rows.

8. The device according to claim 1, further comprising:
a controlled switch on at least one electrical output of the battery,
a controller adapted to open the controlled switch.

9. The device according to claim 8, wherein the controller is adapted to open the controlled switch upon reception of at least one predetermined output from at least one of the first monitoring circuit and the second monitoring circuit.

10. The device according to claim 8, wherein the controller is configured to open the controlled switch exclusively upon reception of a first output from the first monitoring circuit and of a second output from the second monitoring circuit.

11. An electrical battery, comprising:
a plurality of battery cells;
a monitoring device comprising:
  a first group of electrical sensing switches connected in series on a first monitoring circuit, said sensing switches being adapted to switch between a first state and a second state depending on at least one parameter of at least one battery cell of the battery;
  a second group of electrical sensing switches connected in series on a second monitoring circuit, said sensing switches are configured to switch between a first state and a second state depending on at least one parameter of at least one battery cell of the battery, the second monitoring circuit being electrically isolated from the first monitoring circuit;
  an input unit connected to the first monitoring circuit at a first input point and to the second monitoring circuit at a second input point, said first input point being adapted to provide an electrical input to the first monitoring circuit and to the second monitoring circuit;
  a monitoring unit adapted to receive at least one electrical output from the first monitoring circuit and at least one electrical output from the second monitoring circuit;
wherein
the first monitoring circuit comprises at least two measuring points connected to the monitoring unit, said at least two measuring points being located downstream and separate from the first input point by at least one sensing switch of the first group;
the monitoring unit is configured to receive at least two electrical outputs from the at least two measuring points of the first monitoring circuit;
the at least two measuring points are separated by at least one sensing switch.

12. The battery according to claim 11, wherein the second monitoring circuit comprises at least two measuring points separating at least two groups, called monitored rows, of sensing switches.

13. The battery according to claim 11, wherein a battery cell of the plurality of the battery cells is proximate to at least one sensing pair comprising at least one sensing switch of the first group and to at least one sensing switch of the second group.

14. The battery according to claim 11, wherein the at least two measuring points of the first monitoring circuit separate at least two groups, called monitored columns, of sensing switches.

15. The battery according to claim 14, wherein each battery cell is proximate to at least one sensing switch pertaining to at least one monitored row of the first monitoring circuit and to at least one sensing switch pertaining to at least one monitored column of the second monitoring circuit.

* * * * *